United States Patent
Gicquel et al.

(10) Patent No.: US 7,525,370 B2
(45) Date of Patent: Apr. 28, 2009

(54) CIRCUITS FOR GENERATING A REFERENCE VOLTAGE

(75) Inventors: Hugo Gicquel, Grenoble (FR);
Jean-Luc Moro, Grenoble (FR); Marc Sabut, Eybens (FR)

(73) Assignee: STMicroelectronics S.A., Montrouge (FR)

( * ) Notice: Subject to any disclaimer, the term of this patent is extended or adjusted under 35 U.S.C. 154(b) by 146 days.

(21) Appl. No.: 11/724,474

(22) Filed: Mar. 15, 2007

(65) Prior Publication Data
US 2007/0216472 A1    Sep. 20, 2007

(30) Foreign Application Priority Data
Mar. 15, 2006   (FR) .................................. 06 50876

(51) Int. Cl.
*G05F 1/10* (2006.01)
(52) U.S. Cl. .................... 327/538; 327/540; 327/541
(58) Field of Classification Search ................ 327/538, 327/540, 541
See application file for complete search history.

(56) References Cited

U.S. PATENT DOCUMENTS 5,027,016 A * 6/1991 Hanna et al. ................. 327/310

| | | | |
|---|---|---|---|
| 2003/0011350 A1 | 1/2003 | Gregorius |
| 2003/0214275 A1 | 11/2003 | Biagi |
| 2003/0218450 A1 | 11/2003 | Bonte |

OTHER PUBLICATIONS

French Search Report from French Patent Application 06/50876, filed Mar. 15, 2006.

* cited by examiner

*Primary Examiner*—Kenneth B. Wells
(74) *Attorney, Agent, or Firm*—Lisa K. Jorgenson; William R. McClellan; Wolf, Greenfield & Sacks, P.C.

(57) ABSTRACT

A circuit of generation of a reference voltage by a first MOS transistor connected to a first terminal of application of a supply voltage, the first transistor being in series with a second MOS transistor controlled by an input stage of a transconductance amplifier and their junction point defining an output terminal providing the reference voltage, a first current source connecting the first supply terminal to a gate of the first transistor, a second current source connecting the second transistor to a second terminal of application of the supply voltage, at least one third MOS transistor connecting the two current sources, and a capacitive element directly connecting the output terminal to a conduction terminal of the third transistor to vary the conduction of this third transistor in case of a variation in output voltage.

14 Claims, 3 Drawing Sheets

CIRCUITS FOR GENERATING A REFERENCE VOLTAGE

BACKGROUND OF THE INVENTION

1. Field of the Invention

The present invention generally relates to electronic circuits, and more specifically to the generation of reference voltages close to the circuit supply voltages.

An example of application of the present invention relates to analog-to-digital converters and to the generation of reference voltages defining the levels of states "0" and "1" of the bits. More generally, the present invention applies as soon as at least one reference voltage close to the level of a supply voltage is desired (for example, digital-to-analog converters and reference circuits for video signals).

2. Discussion of the Related Art

FIG. 1 is a schematic block diagram of an example of an analog-to-digital converter 1 (ADC) of the type to which the present invention applies. Such a converter is supplied by a D.C. voltage Vdd applied between two terminals 2 and 3 of circuit 1. In the example of FIG. 1, the converter has differential inputs. A differential signal Vin is applied between two input terminals 4 and 5 of the converter, which also receives two reference signals VrefP and VrefM on inputs 6 and 7. Reference signals VrefP and VrefM provide voltage levels around half the supply voltage Vdd/2. A sampling frequency is set by a clock signal Clk applied on a clock input 9. Circuit 1 provides a binary signal OUT over n bits on a series output or several parallel outputs 8.

FIG. 2 illustrates, with a voltage scale, the operation of the converter of FIG. 1. Voltages VrefP and VrefM range between levels Vdd and 0 on either side of median level Vdd/2. Difference ΔV between levels VrefP and VrefM defines the converter dynamics. The greater this interval, the better the signal-to-noise ratio of the converter. Gap g+ between voltage Vdd and voltage VrefP and gap g− between voltage VrefM and the ground (0) are linked to technological constraints of the circuit, as will be seen hereafter.

Within converter 1, reference signals VrefP and VrefM are applied to one or several elements operating as current sources, which absorb (on level VrefP) or provide (on level VrefM) a current depending on the work frequency of the converter and on the number of stages respectively providing states 0 and states 1.

After, the present invention will be described in relation with the generation of a single reference level VrefP close to positive level Vdd of the supply voltage. It should however be noted that it more generally applies to the generation of positive or negative reference signals, for example, in a differential application. Similarly, for simplification, reference will be made to a negative reference (level 0) corresponding to ground, knowing that it may be any positive or negative level lower than level Vdd.

FIG. 3 schematically shows a conventional example of a circuit for generating a reference voltage VrefP of the type to which the present invention applies. Voltage VrefP is provided by an N-channel MOS transistor MN1, connected between a line 2 of provision of voltage Vdd and a current source 11 connected to ground 3. Transistor MN1 and source 11 form the output stage of a transconductance amplifier 10 having a first input 14 receiving, through a resistor R1, a fixed reference voltage VBG linked to the technology (generally called bandgap voltage), and having a second input connected to ground. Internally, the first input is connected to an input amplifier 12(A). Output 13 of the circuit (drain of transistor MN1) is looped back on input 14 by a resistor R2. The respective values of resistors R1 and R2 set the value of level VrefP with respect to level VBG.

The assembly of FIG. 3 is generally called a "follower" assembly and its function is to provide the current necessary to the operation of the circuits connected downstream of terminal 13, while maintaining voltage level VrefP.

In applications where supply voltage Vdd is relatively low (less than 3 V, typically 2.5 V), it is difficult to maintain level VrefP close to level Vdd. Indeed, the operation of the follower of FIG. 3 requires a voltage of approximately 600 mV, or even 900 mV, to provide the gate-source voltage of transistor MN1 which imposes the voltage difference between terminal 2 and terminal 13. The drop out voltage of amplifier 12 adds to this gate-source problem. As a result, in practice, voltage level VrefP is around one volt. By applying the same circuit on the side of generation of level VrefM with respect to ground, it can be seen that a dynamic range of a few hundreds of millivolts is obtained for the converter, which is in practice insufficient. Accordingly, this solution is not adapted to such low supply voltages.

To bring level VrefP closer to level Vdd, the structure of the output stage is generally inverted by connecting a P-channel MOS transistor in series with a current source between terminals 2 and 3. However, this requires sizing this transistor to the worst operating case of the application, since it must support all of the current if the downstream circuit (the converter) absorbs no current.

FIG. 4 shows another conventional example of a follower circuit 20 for generating a reference voltage VrefP for an analog-to-digital converter 1. In FIG. 4, current source 15 to which converter 1 is equivalent, for reference voltage VrefP, has been illustrated in dotted lines. Input 4 of converter 1 is grounded by an external capacitor Cext has the function of stabilizing level VrefP. For simplification, only the output stage of the follower amplifier has been shown in FIG. 4. Of course, such an assembly also comprises a feedback (resistors R1 and R2) with input 14 of amplifier 20.

In the example of FIG. 4, a P-channel MOS transistor MP1 is controlled by input amplifier 12 of the assembly and is connected, by a current source 21, to the terminal of application of voltage Vdd. The fact of transferring the current source on the positive supply side enables avoiding the significant voltage drop linked to the gate-source voltage of the N-channel MOS transistor of FIG. 3. A second current source 22 connects the drain of transistor MP1 to ground 3 and this drain is connected to a third current source 23, mirror-assembled on current source 21. The mirror ratio generally is one and current source 22 is a fixed current source absorbing the sum of the currents provided by sources 21 and 22. For example, a first P-channel MOS transistor MP2 forming source 21 connects terminal 2 to the source of transistor MP1. Its gate is directly connected to that of a second transistor MP3 forming current source 23, the common gates being further connected to the drains of transistors MP1 and MP3. Such an assembly enables decreasing the size of MOS transistor MP1, since it does not carry continuously the maximum current (worst case) absorbed by downstream converter 1.

When converter 1 draws current (source 15), amplifier 12 reacts by increasing the gate voltage of transistor MP1. This results in opening transistor MP1 and mirror transistor MP2 then provides the converter with a current corresponding to the value set by source 21. Conversely, when the converter draws no current, transistor MP1 is on and the fixed current absorbed by source 22 is not only provided by transistor MP1, but also by transistor MP3.

As compared with the assembly of FIG. 3, the assembly of FIG. 4 enables reaching a voltage VrefP on the order of 2 volts for a voltage Vdd on the order of 2.2 volts (level Vdd decreased by approximately 0.2 V for the operation of transistor MP2).

By reproducing a similar assembly (based on N-channel transistors) on the negative terminal side (ground 3) of the power supply, a second reference level VrefM at approximately 0.2 V may be generated, which provides greater dynamic range at 1 V to the converter. Such a dynamic range is acceptable in most cases.

However, a disadvantage of the solution of FIG. 4 is that the current absorbed by source 22 remains set by the worst case of operation of the downstream-connected circuits and thus generates a significant power consumption. The output of such a reference voltage generator thus remains low.

Another disadvantage of the assembly of FIG. 4 is the nearly compulsory use of an external capacitor Cext between follower circuit 20 and converter 1. Two external capacitors are further necessary to stabilize the two reference levels VrefP and VrefM in the case of a differential system.

Such external capacitor(s) in practice have values of several microfarads, which makes them bulky. Further, the use of external capacitors generates other disturbances linked to the packages and to the connection terminals.

SUMMARY OF THE INVENTION

The present invention aims at overcoming all or part of the disadvantages of known reference voltage generators aiming at generating a reference level close to a circuit supply level.

The present invention more specifically aims at providing an entirely integrable reference level generator having no external capacitor between a follower amplifier and an input of a downstream circuit exploiting the generated reference voltage.

The present invention also aims at a reference level generator in which the consumption is adapted to the current required by the downstream-connected circuits.

The present invention also aims at a solution compatible with a use in non-differential mode and in differential mode.

The present invention also aims at a solution particularly well adapted to analog-to-digital and digital-to-analog converters, providing them speed and stability.

To achieve all or part of these objects, as well as others, the present invention provides a circuit of generation of a reference voltage by a first MOS transistor of a first channel type connected to a first terminal of application of a supply voltage, said first transistor being in series with a second MOS transistor of the same channel type controlled by an input stage of a transconductance amplifier and their junction point defining an output terminal providing the reference voltage, comprising:

a first current source of fixed value connecting said first supply terminal to a gate of the first transistor;

a second current source of fixed value connecting the second transistor to a second terminal of application of the supply voltage;

at least one third MOS transistor of a second channel type connecting the two current sources; and a capacitive element directly connecting said output terminal to a conduction terminal of the third transistor to vary the conduction of this third transistor in case of a variation in the output voltage.

According to an embodiment of the present invention, the third transistor directly connects the gate of the first transistor to the second current source, said capacitive element being in parallel on the second transistor.

According to an embodiment of the present invention, a fourth transistor of the second channel type is interposed between the third transistor and the second current source, said capacitive element connecting said output terminal to the junction point of the third and fourth transistors.

According to an embodiment of the present invention, the circuit is formed with at least two types of transistors which differentiate by their respective gate oxide thicknesses, the first and third transistors being formed with a relatively thin gate oxide with respect to the second transistor.

According to an embodiment of the present invention, the fourth transistor is made of a relatively thick oxide.

According to an embodiment of the present invention, the first transistor is sized according to the current capable of being sourced or sunk by the circuits connected to the output terminal.

According to an embodiment of the present invention, the second transistor is sized according to the fixed value of the current sources.

According to an embodiment of the present invention, the second current source is formed of a MOS transistor of the second type biased by a fixed signal.

According to an embodiment of the present invention, the first current source is formed of a MOS transistor of the first type.

According to an embodiment of the present invention, applied to the generation of a voltage closer to that of the first terminal than to that of the second terminal, the first and second channel types are respectively P and N.

According to an embodiment of the present invention, applied to the generation of a voltage closer to that of the second terminal than to that of the first terminal, the first and second channel types are respectively N and P.

The foregoing and other objects, features, and advantages of the present invention will be discussed in detail in the following non-limiting description of specific embodiments in connection with the accompanying drawings.

DETAILED DESCRIPTION

Figure 1:
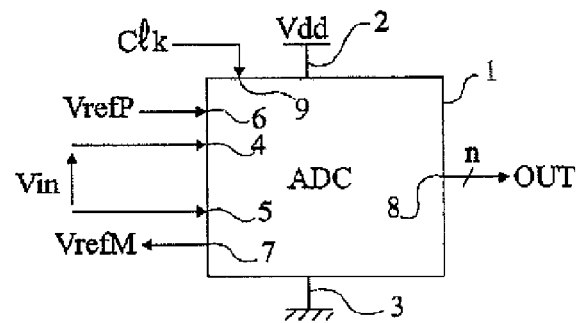
FIG. 1, previously described, very schematically shows in the form of blocks an analog-to-digital converter with differential inputs of the type to which the present invention applies as an example.
Figure 2:
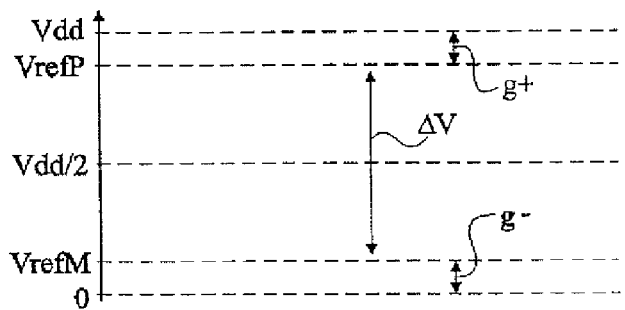
FIG. 2, previously described, shows an example of a voltage scale of the converter of FIG. 1.

The same elements have been designated with the same reference numerals in the different drawings. For clarity, only those elements which are useful to the understanding of the present invention have been shown and will be described hereafter. In particular, the details constitutive of a circuit (for example, an analog-to-digital converter) using reference voltages generated by an assembly of the present invention have not been discussed, the present invention generating no modification of the circuits connected downstream of the reference voltage generation circuit.

Figure 5:
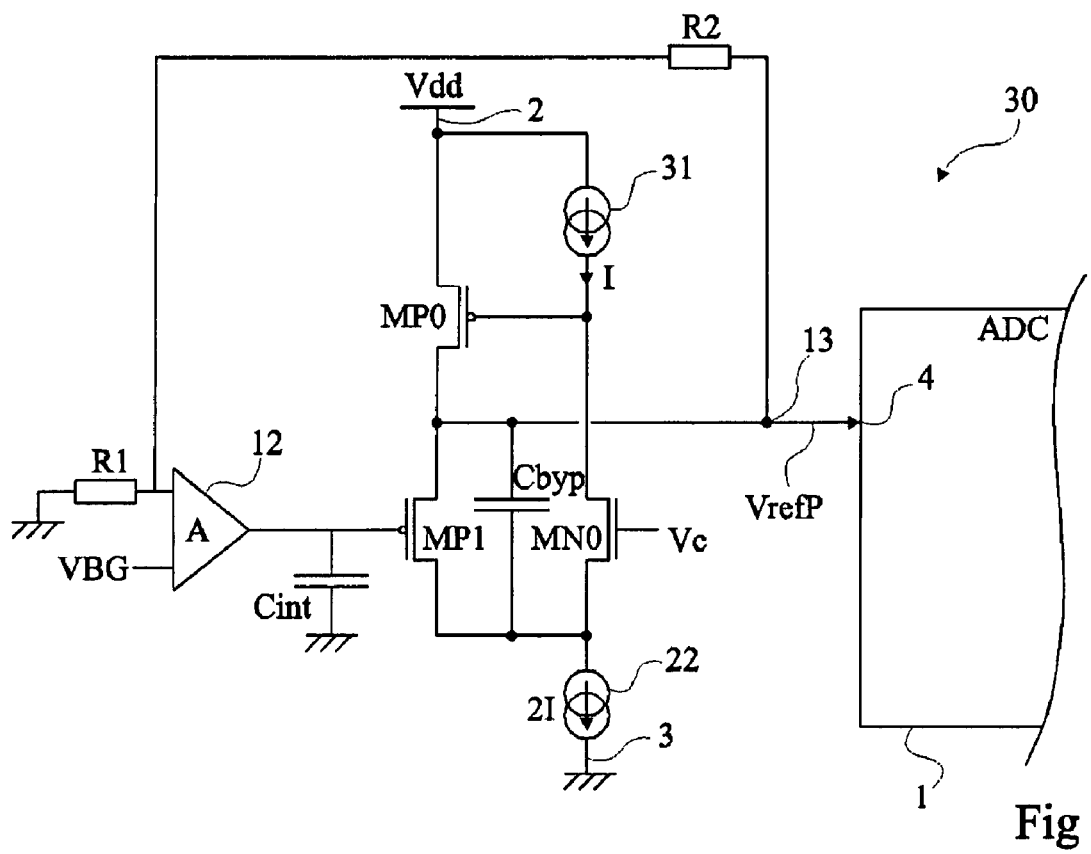
FIG. 5 shows a first embodiment of a circuit for generating a reference voltage according to the present invention.

FIG. 5 partially and schematically shows a first embodiment of a circuit 30 forming a follower assembly for generating a positive voltage VrefP according to the present invention. This voltage is, for example, intended for an analog-to-digital conversion circuit 1 ADC having an input terminal 4 receiving level VrefP.

Figure 3:
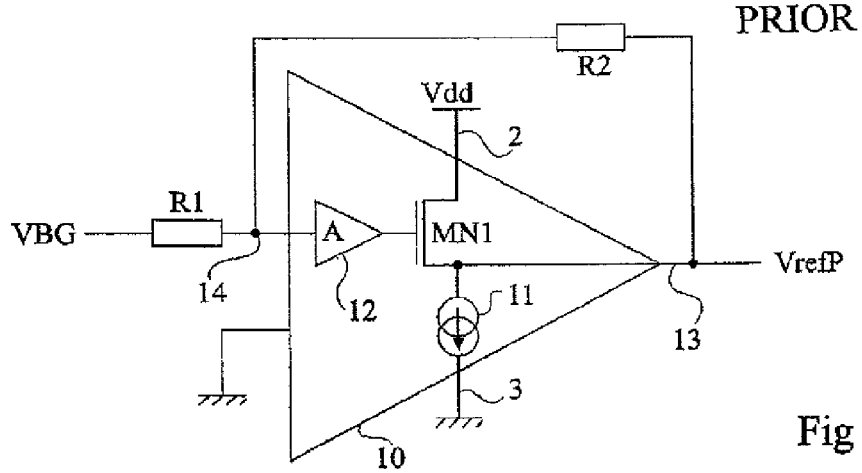
FIG. 3, previously described, schematically shows a first conventional example of a follower assembly of generation of a reference voltage.
Figure 4:
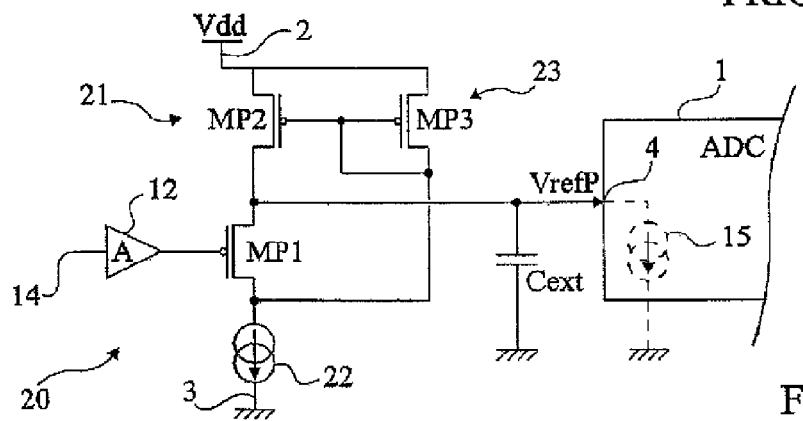
FIG. 4, previously described, shows a second conventional example of a follower assembly of generation of a reference voltage.

As in the previous solution of FIG. 4, an input amplifier 12 (A) receiving a reference level (for example, a bandgap-type voltage VBG) controls a P-channel MOS transistor MP1 having its source providing voltage VrefP on an output terminal 13. In the example of FIG. 5, amplifier 12 is a differential amplifier receiving, on a first input, level VBG and, on a second input, information representative of voltage VrefP via a resistive dividing bridge (resistors R2 and R1 in series between terminal 13 and the ground). This is an alternative to the input assembly of FIG. 3 but does not change the operating principle. A capacitor Cint connects the gate of transistor MP1 to ground to stabilize the assembly. The value of this capacitor (on the order of one picofarad) is negligible with respect to the values of conventional external capacitors.

The source of transistor MP1 is connected to a terminal 2 of application of a supply voltage Vdd by a P-channel MOS transistor MP0 having its gate connected to terminal 2 by a current source 31. Unlike the assembly of FIG. 4, current source 31 provides a fixed current 1, and the transistor forming this current source is thus not mirror-assembled on transistor MP0. A second fixed current source 22 connects the drain of transistor MP1 to ground 3 and an N-channel MOS transistor MN0 connects the gate of transistor MP0 (output of source 31) to the drain of transistor MP1. The function of transistor MN0 is to set the drain voltage of transistor MP1 with respect to ground 3, which amounts to making this drain level independent from the gate voltage of transistor MP0 to enable the operation of transistor MP1. Source 31 of fixed value is, preferably, a current mirror of source 22. Transistor MN0 is controlled by a fixed voltage signal Vc, the generation of which will be described hereafter in relation with FIG. 7. Voltage Vc is a constant voltage since transistor MN0 is always on. Voltage Vc is selected to be greater than the drain-source saturation voltage of the transistor forming source 22, plus gate-source voltage drop Vgs of transistor MN0.

A feature of this first embodiment is to provide a capacitive element Cbyp between terminal 13 and the terminal of transistor MN0 to rapidly transfer a voltage variation on terminal 13 linked to a variation in the current sampling by downstream circuit 1 from the source of transistor MN0. For example, in case of an increase in this current drawing, the voltage of terminal 13 starts decreasing. This decrease is transmitted by capacitor Cbyp onto the source of transistor MN0. Since the gate voltage of this transistor MN0 is fixed, the decrease in the voltage of terminal 13 translates as an increase in gate-source voltage Vgs of transistor MN0. The current flowing therethrough increases, which results in a decrease in the gate voltage of transistor MP0 (source 31 providing a fixed current). By thus increasing the gate-source voltage of transistor MP0, said transistor may provide a greater current and thus rapidly respond to the additional current drawing by the load. If this increase in the current drawn by the load lasts, amplifier 12 causes a decrease in the gate voltage of transistor MP1, which increases the current in this transistor to reach value I and find a situation of balance with that flowing through transistor MN0.

Circuit 30 of FIG. 5 thus functionally comprises a relatively fast reaction element formed by capacitor Cbyp to transfer a variation of the voltage of terminal 13 onto the source of transistor MN0, and a slower reaction loop through resistors R1 and R2.

Figure 6:
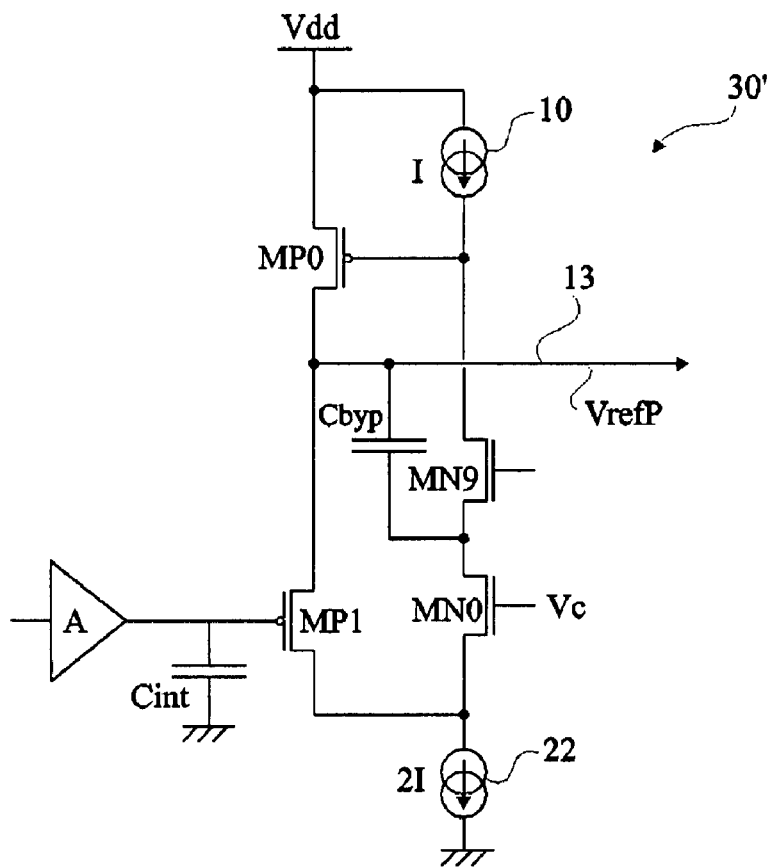
FIG. 6 shows a second embodiment of a reference generation circuit according to the present invention.

FIG. 6 shows a follower assembly 30' according to a second embodiment of the present invention. For simplification, the feedback loop formed of resistors R1 and R2 of FIG. 5, although present in FIG. 6, has not been shown, and neither has the load (the converter).

As compared with the assembly of FIG. 5, a first difference is the addition of an N-channel MOS transistor MN9 between current source 31 and transistor MN0. A second difference is the connection of capacitive element Cbyp between terminal 13 and the junction point of transistor MN9 and transistor MN0. The gate of transistor MN9 receives a biasing signal, an example of which will be subsequently discussed in relation with FIG. 7.

In this embodiment, the gate-source voltage of transistor MN0 remains fixed and capacitive element Cbyp intervenes on the conduction of transistor MN9. A modification in voltage VrefP at the output of the assembly immediately translates as a modification in the drain voltage of transistor MN0 (source of transistor MN9). The current increase or decrease which results therefrom in transistor MN9 generates a decrease or an increase in the gate voltage of transistor MP0, which then provides more or less current to the load. As in the first embodiment, if the phenomenon lasts, the feedback on the input amplifier (here shown in simplified fashion as in FIG. 4) modifies the gate-source voltage of transistor MP1 to balance back its current with that of transistor MN0.

The order of magnitude of capacitive element Cbyp used in the present invention is the picofarad, which makes this element integrable. Indeed, capacitive element Cbyp is not used, conversely to the capacitive element (Cext, FIG. 4) of output of the conventional assembly, as a storage tank to provide the load drawings, but as a stabilization element of the loop formed by transistors MP0, MP1, and MN0. Element Cext can thus be smaller.

The values of current sources 31 and 22 are selected to be as low as possible, knowing that the greater the current, the faster the system is to charge and discharge the gate capacitor of transistor MP0. Since transistor MP0 is sized according to the worst case for the application to be able to convey the current drawn by the downstream-connected circuits, its gate capacitance conditions the sizes of current sources 31 and 22.

An advantage of the second embodiment over the first one is that it decreases the effects of a stray capacitance present between the source of transistor MN0 and the ground which is, in the example of FIG. 5, in series with capacitive element Cbyp and which is due to transistors MP0, MN0 and to the transistor forming source 22.

An advantage of the present invention is that the reference voltage generation circuit is fast and steady without it being necessary to use external capacitive elements, nor to increase the currents in current sources 31 and 22. Indeed, it could have been devised to increase the rapidity of the assembly by increasing currents I and 21 of current sources 31 and 22. But this increases the assembly consumption and does not solve stability problems.

Figure 7:
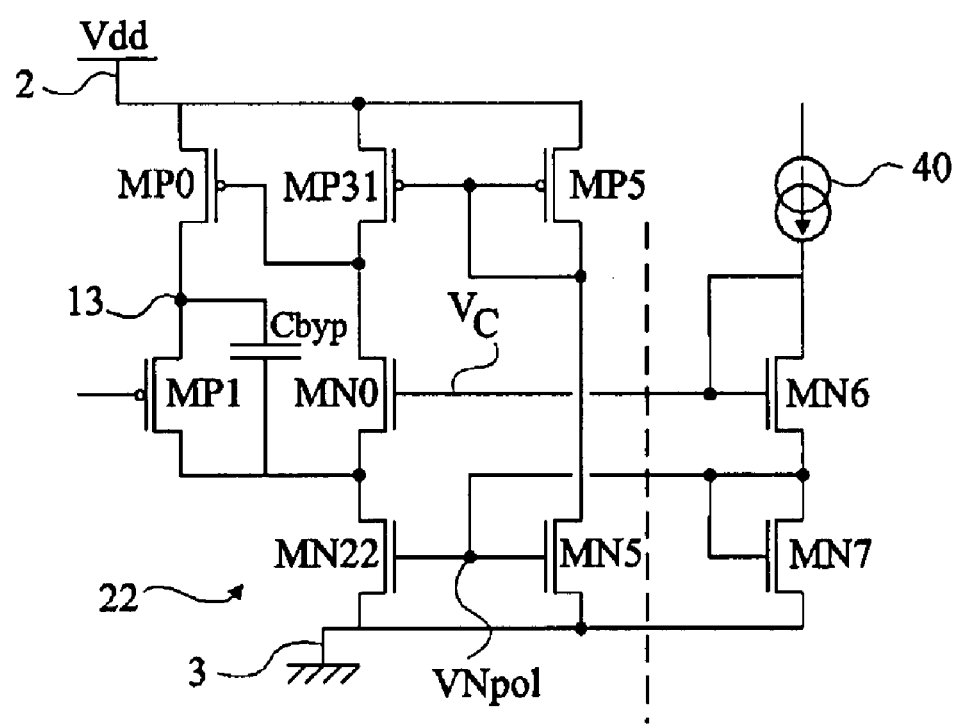
FIG. 7 is a partially detailed electric diagram of the circuit of FIG. 5.

FIG. 7 shows a partial detailed electric diagram illustrating an embodiment of current sources 31 and 22, as well as the generation of signal Vc according to the present invention.

Current source 22 comprises an N-channel MOS transistor MN22 connecting the drain of transistor MP1 to ground 3. The gate of transistor MN22 receives a biasing signal VNpol. This signal corresponds to the biasing signal currently generated to bias all the N-channel transistors of the circuit and can be found in all conventional systems.

Current source 31 is formed of a P-channel MOS transistor MP31 connecting terminal 2 to the gate of transistor MP0. To set the ratio between current I of source 31 and that of source 22 in fixed fashion, transistor MP31 is assembled as a current mirror on P-channel MOS transistor MP5, itself in series with an N-channel MOS transistor MN5 between terminals 2 and 3. Transistor MN5 has its gate connected to that of transistor MN22 while transistor MP5 has its gate connected to its drain and to the gate of transistor MP31. The ratio (for example, 2) between current sources 22 and 31 is set by the surface area ratio between transistors MP5 and MP31. Assuming that transistors MN5 and MN22 both have the same size, a transistor MP5 of double size with respect to that of transistor MP31 sets a ratio 2 between sources 22 and 31.

Signals Vc and VNpol are provided, for example, by two diode-assembled N-channel MOS transistors MN6 and MN7 series-connected between a current source 40 and the ground, source 40 providing a constant or temperature-compensated current. The gates of transistors MN6 and MN7 are connected to the respective gates of transistors MN0 and MN22.

In the case of the assembly of FIG. 6 (variation shown in dotted lines in FIG. 7), transistor MN9 is biased by an N-channel MOS transistor MN8, diode-assembled between current source 40 and transistor MN6. The drain of transistor MN8 is connected to its gate and to the gate of transistor MN9 and its source is connected to the drain of transistor MN6.

In a technology where relatively fast transistors (relatively thin gate oxide—simple oxide) and other relatively slow transistors (relatively thick gate oxide—double oxide) but with a better breakdown voltage are available, the different assembly transistors are selected according to their respective needs in terms of rapidity and breakdown voltage.

Taking this example, in the embodiment of FIG. 5, transistors MP0 and MP31 are selected to be relatively fast to rapidly modify the gate voltage of transistor MP0. Transistor MP1 needs not be fast since it belongs to the slow regulation loop. It however needs withstanding the voltage.

In the first embodiment (FIG. 5), transistor MN0 is in the fast feedback loop and is thus selected to be relatively fast.

In the second embodiment (FIG. 6), transistor MN0 may be a slow transistor while transistor MN9 is selected to be fast.

In a practical embodiment of the present invention, transistors, not shown, are preferably inserted into the circuit to then protect the fast transistors against overvoltages thereacross when the circuit is not in operation. Such protection transistors are selected to withstand the voltage (they are thus slow) and aim at bringing all the fast transistor terminals to a same voltage (generally, Vdd).

In the first embodiment (FIG. 5), this amounts to drawing to voltage Vdd the gates of transistors MP0, MP31, and MP5, the drain of transistor MP0 (requiring insertion of an additional transistor to open the circuit between transistors MP0 and MP1 on turning-off), and the source of transistor MN0.

In the second embodiment (FIG. 6), the only modification is to draw to voltage Vdd the junction point of transistors MN9 and MN0 instead of the source of transistor MN0.

The present invention brings other advantages than the suppression of an external capacitor and the possibility of integrating the entire circuit, among which:

the need for a single transistor (MP0) sized to stand all the current of the application;

a decrease in the quiescent consumption of the system by making the current absorbed by the downstream circuit independent from the currents consumed by the control structure; and a compatibility of the assembly with the generation of reference voltages close to the supply levels.

Of course, the present invention is likely to have various alterations, improvements, and modifications which will readily occur to those skilled in the art. In particular, the transposition of the described circuit to the generation of a reference voltage with respect to ground from a dual assembly by replacing the N-channel transistors with P-channel transistors and conversely is within the abilities of those skilled in the art based on the functional indications given hereabove. Further, the respective dimensions to be given to the different transistors according to the application are also within the abilities of those skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit of generation of a reference voltage by a first MOS transistor of a first channel type connected to a first terminal of application of a supply voltage, said first transistor being in series with a second MOS transistor of the same channel type controlled by an input stage of a transconductance amplifier, a junction point of the first and second transistors defining an output terminal providing the reference voltage, comprising:

a first current source of fixed value connecting said first supply terminal to a gate of the first transistor;

a second current source of fixed value connecting the second transistor to a second terminal of application of the supply voltage;

at least one third MOS transistor of a second channel type connecting the first and second current sources; and a capacitive element directly connecting said output terminal to a conduction terminal of the third transistor to vary the conduction of the third transistor in case of a variation in the output voltage.

2. The circuit of claim 1, wherein the third transistor directly connects the gate of the first transistor to the second current source, said capacitive element being in parallel with the second transistor.

3. The circuit of claim 1, wherein a fourth transistor of the second channel type is interposed between the third transistor and the second current source, said capacitive element connecting said output terminal to the junction point of the third and fourth transistors.

4. The circuit of claim 1, wherein the circuit is formed with at least two types of transistors which differentiate by their respective gate oxide thicknesses, the first and third transistors being formed with a relatively thin gate oxide with respect to the second transistor.

5. The circuit of claim 3, wherein the fourth transistor comprises a relatively thick gate oxide.

6. The circuit of claim 1, wherein the first transistor is sized according to the current capable of being sourced or sunk by the circuits connected to the output terminal.

7. The circuit of claim 1, wherein the second transistor is sized according to the fixed value of the current sources.

8. The circuit of claim 1, wherein the second current source is formed of a MOS transistor of the second type biased by a fixed signal.

9. The circuit of claim 8, wherein the first current source comprises a MOS transistor of the first type.

10. The circuit of claim 1, for generating a voltage closer to that of the first terminal than to that of the second terminal, wherein the first and second channel types are respectively P and N.

11. The circuit of claim 1, for generating a voltage closer to that of the second terminal than to that of the first terminal, wherein the first and second channel types are respectively N and P.

12. A circuit for generating a reference voltage comprising:
a first MOS transistor of a first channel type connected to a first power supply terminal;
a second MOS transistor of the first channel type controlled by an input stage, wherein the first transistor is in series with the second transistor and a junction point of the first and second transistors defines an output terminal providing the reference voltage;
a first current source connecting the first power supply terminal to a gate of the first transistor;
a second current source connecting the second transistor to a second power supply terminal;
at least one third MOS transistor of a second channel type connecting the first and second current sources; and
a capacitive element connecting the output terminal to a conduction terminal of the third transistor to vary the conduction of the third transistor in response to a variation in the reference voltage.

13. The circuit of claim 12, wherein the third transistor directly connects the gate of the first transistor to the second current source.

14. The circuit of claim 12, further including a fourth transistor of the second channel type connected between the third transistor and the second current source, wherein the capacitive element connects the output terminal to a junction point of the third and fourth transistors.

* * * * *

UNITED STATES PATENT AND TRADEMARK OFFICE
CERTIFICATE OF CORRECTION

PATENT NO. : 7,525,370 B2
APPLICATION NO. : 11/724474
DATED : April 28, 2009
INVENTOR(S) : Hugo Gicquel et al.

It is certified that error appears in the above-identified patent and that said Letters Patent is hereby corrected as shown below:

Col. 5, line 30, should read:
source 31 provides a fixed current I, and the transistor form- Signed and Sealed this Twenty-third Day of June, 2009

JOHN DOLL
*Acting Director of the United States Patent and Trademark Office*